United States Patent
Wang et al.

(10) Patent No.: US 11,372,504 B2
(45) Date of Patent: Jun. 28, 2022

(54) TOUCH PANEL AND TOUCH DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yangpeng Wang, Beijing (CN); Yang Wang, Beijing (CN); Kuo Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 420 days.

(21) Appl. No.: 16/484,831

(22) PCT Filed: Jan. 10, 2019

(86) PCT No.: PCT/CN2019/071101
§ 371 (c)(1),
(2) Date: Aug. 9, 2019

(87) PCT Pub. No.: WO2019/233107
PCT Pub. Date: Dec. 12, 2019

(65) Prior Publication Data
US 2021/0365136 A1 Nov. 25, 2021

(30) Foreign Application Priority Data
Jun. 7, 2018 (CN) .......................... 201810579908.0

(51) Int. Cl.
G06F 3/044 (2006.01)
G06F 3/041 (2006.01)
H05K 1/18 (2006.01)

(52) U.S. Cl.
CPC ............ *G06F 3/044* (2013.01); *G06F 3/0412* (2013.01); *H05K 1/189* (2013.01)

(58) Field of Classification Search
CPC .... G06F 3/044; G06F 3/0412; G06F 3/04164; H05K 1/189
See application file for complete search history.

(56) References Cited

U.S. PATENT DOCUMENTS 9,158,396 B2 * 10/2015 Choi ........................ G06F 3/041
10,312,313 B2 * 6/2019 Oh ......................... H05K 1/189
(Continued)

FOREIGN PATENT DOCUMENTS

| CN | 103943660 A | 7/2014 |
| CN | 105373282 A | 3/2016 |

(Continued)

OTHER PUBLICATIONS

First Office Action for Chinese Patent Application No. 201810579908.0 dated Mar. 2, 2020.

*Primary Examiner* — Grant Sitta
(74) *Attorney, Agent, or Firm* — Calfee, Halter & Griswold LLP

(57) ABSTRACT

A touch panel and a touch device comprising the touch panel. The touch panel comprises a substrate; a display function stack on a side of the substrate; and a touch layer on a side of the display function stack away from the substrate. The touch layer and the display function stack are electrically connected to a flexible circuit board via a substrate wiring layer.

12 Claims, 3 Drawing Sheets

(56) References Cited

U.S. PATENT DOCUMENTS

| | | | |
|---|---|---|---|
| 10,739,886 B2* | 8/2020 | Zhu | G06F 3/0443 |
| 11,016,591 B2* | 5/2021 | Jin | G06F 3/0443 |
| 2012/0319967 A1* | 12/2012 | Tsai | G06F 3/04164 |
| | | | 345/173 |
| 2014/0375907 A1* | 12/2014 | Wu | G06F 3/04164 |
| | | | 349/12 |
| 2015/0287748 A1 | 10/2015 | Jin et al. | |
| 2016/0274693 A1* | 9/2016 | Liu | G06F 3/0412 |
| 2016/0372497 A1* | 12/2016 | Lee | H01L 27/1222 |
| 2017/0123543 A1* | 5/2017 | Choi | H01L 27/323 |
| 2017/0160847 A1 | 6/2017 | Huo | |
| 2018/0097042 A1 | 4/2018 | Miyamoto et al. | |
| 2018/0253170 A1* | 9/2018 | Noh | G06F 3/0443 |
| 2018/0267649 A1* | 9/2018 | Ye | G06F 3/0443 |
| 2018/0341290 A1* | 11/2018 | Sim | G06F 1/1643 |
| 2019/0095007 A1* | 3/2019 | Jeong | H01L 27/323 |
| 2019/0181209 A1 | 6/2019 | Zhang et al. | |
| 2020/0201392 A1* | 6/2020 | Yu | H01L 27/3276 |
| 2021/0004101 A1* | 1/2021 | Wei | G06F 1/1643 |

FOREIGN PATENT DOCUMENTS

| | | |
|---|---|---|
| CN | 205140986 U | 4/2016 |
| CN | 105630244 A | 6/2016 |
| CN | 105845708 A | 8/2016 |
| CN | 106876431 A | 6/2017 |
| CN | 108091673 A | 5/2018 |
| CN | 108762593 A | 11/2018 |

* cited by examiner

TOUCH PANEL AND TOUCH DEVICE

CROSS REFERENCE TO RELATED APPLICATIONS

This application is the U.S. national phase entry of PCT Application No. PCT/CN2019/071101, filed Jan. 10, 2019, which is based upon and claims priority to Chinese Patent Application No. 201810579908.0, filed on Jun. 7, 2018, the entire contents of which are incorporated herein by reference.

FIELD

The present disclosure generally relates to the field of display technologies. More specifically, the present disclosure relates to a touch panel, and a touch device comprising the touch panel.

BACKGROUND

The emergence of touch devices has greatly enriched the functions of display devices and brought many novel applications. Touch devices perform sensing in various ways, such as using optics, microwaves, resistors, capacitors, etc., wherein capacitive touch devices are widely used in the field of touch display due to their advantages such as accurate, sensitive positioning, good touch feeling, long service life, and the like.

SUMMARY

According to an exemplary embodiment, there is provided a touch panel comprising: a substrate; a display function stack on a side of the substrate; and a touch layer on a side of the display function stack away from the substrate. The touch layer and the display function stack are electrically connected to a flexible circuit board via a substrate wiring layer.

According to some exemplary embodiments, the above touch panel further comprises a package cover and a first contact on a side of the package cover facing the display function stack. The touch layer is electrically connected to the substrate wiring layer via the first contact.

According to some exemplary embodiments, the touch layer is between the display function stack and the package cover.

According to some exemplary embodiments, the touch layer is on a side of the package cover away from the display function stack, and the touch layer is electrically connected to the first contact via at least one via hole disposed in the package cover.

According to some exemplary embodiments, at least one of the first contact and the at least one via hole are disposed at an edge of the package cover.

According to some exemplary embodiments, the above touch panel further comprises an electric conductor between the first contact and the substrate wiring layer. The first contact is electrically connected to the substrate wiring layer via the electric conductor.

According to some exemplary embodiments, the display function stack comprises a transistor, a capacitor, and an electrode layer. A gate of the transistor and a first electrode of the capacitor are located in a same layer and fabricated by a same process. A source of the transistor, a drain of the transistor, a second electrode of the capacitor, and the substrate wiring layer are located in a same layer and fabricated by a same process. The electrode layer and the electric conductor are located in a same layer and fabricated by a same process.

According to some exemplary embodiments, the display function stack comprises a transistor, a capacitor, and an electrode layer. A first electrode of the capacitor and the substrate wiring layer are located in a same layer and fabricated by a same process. A gate of the transistor and a second electrode of the capacitor are located in a same layer and fabricated by a same process. A source of the transistor, a drain of the transistor and a third electrode of the capacitor are located in a same layer and fabricated by a same process. The electrode layer and the electric conductor are located in a same layer and fabricated by a same process.

According to some exemplary embodiments, the electric conductor comprises a first electric conductor and a second electric conductor. The display function stack comprises a transistor, a capacitor, and an electrode layer. A gate of the transistor, a first electrode of the capacitor, and the substrate wiring layer are located in a same layer and fabricated by a same process. A source of the transistor, a drain of the transistor, a second electrode of the capacitor, and the first electric conductor are located in a same layer and fabricated by a same process. The electrode layer and the second electric conductor are located in a same layer and fabricated by a same process.

According to some exemplary embodiments, the electric conductor comprises a first electric conductor and a second electric conductor. The display function stack comprises a transistor, a capacitor, and an electrode layer. A first electrode of the capacitor and the substrate wiring layer are located in a same layer and fabricated by a same process. A gate of the transistor and a second electrode of the capacitor are located in a same layer and fabricated by a same process. A source of the transistor, a drain of the transistor, a third electrode of the capacitor, and the first electric conductor are located in a same layer and fabricated by a same process. The electrode layer and the second electric conductor are located in a same layer and fabricated by a same process.

According to some exemplary embodiments, the electric conductor comprises a first electric conductor, a second electric conductor, and a third electric conductor. The display function stack comprises a transistor, a capacitor, and an electrode layer. A first electrode of the capacitor and the substrate wiring layer are located in a same layer and fabricated by a same process. A gate of the transistor, a second electrode of the capacitor, and the first electric conductor are located in a same layer fabricated by a same process. A source of the transistor, a drain of the transistor, a third electrode of the capacitor, and the second electric conductor are located in a same layer and fabricated by a same process. The electrode layer and the third electric conductor are located in a same layer and fabricated by a same process.

According to some exemplary embodiments, the substrate wiring layer is electrically connected to a second contact, and the second contact is electrically connected to an external controller via the flexible circuit board.

Other exemplary embodiments provide a touch device comprising any of the touch panels described above.

It is to be understood that the above general description and the following detailed description are merely exemplary and illustrative, and are not intended to limit the present disclosure in any way.

BRIEF DESCRIPTION OF THE DRAWINGS

In order to more clearly illustrate the technical solutions in embodiments of the present disclosure, the accompanying drawings to be used for description of the embodiments will be briefly described below. It is apparent that the drawings described below are only some embodiments of the present disclosure. It is to be noted that the dimensions shown in the drawings are merely schematic and are not intended to limit the present disclosure in any way.

Exemplary embodiments have been clearly illustrated by the above-described drawings, which will be described in more detail later. The drawings and literal descriptions are not intended to limit the scope of the present disclosure in any way, but to illustrate the concept of the present disclosure to those ordinarily skilled in the art by reference to specific embodiments.

DETAILED DESCRIPTION

In order to make the purpose, technical solutions and advantages of the present disclosure clearer, the technical solutions of exemplary embodiments will be further described in detail below with reference to the accompanying drawings.

Figure 1:
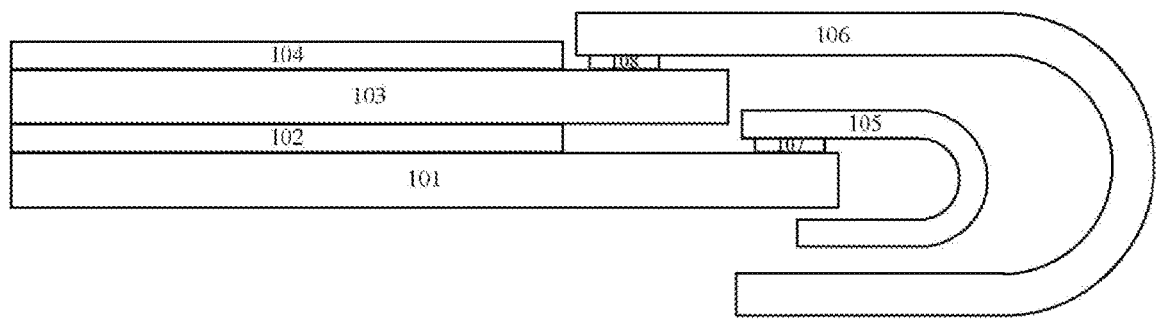
FIG. 1 schematically illustrates a sectional view of a typical touch panel.

FIG. 1 schematically illustrates a sectional view of a typical touch panel. As shown in FIG. 1, the touch panel comprises a substrate 101, a display function stack 102 located on a side of the substrate 101, a cover plate 103 located on a side of the display function stack 102 away from the substrate 101, and a touch layer 104 located on a side of the cover plate 103 away from the display function stack 102. In this touch panel, in order to transmit a display signal and a touch signal to the display function stack 102 and the touch layer 104, respectively, two flexible circuit boards, as shown in FIG. 1, a first flexible circuit board 105 and a second flexible circuit board 106, are generally required to electrically connect the display function stack 102 and the touch layer 104 to a controller external to the touch panel via a first contact 107 and a second contact 108, respectively. The presence of the two flexible circuit boards 105 and 106 makes the structure and manufacturing process of a touch device comprising the touch panel complicated, which is disadvantageous for making the touch device light and thin.

Figure 2:
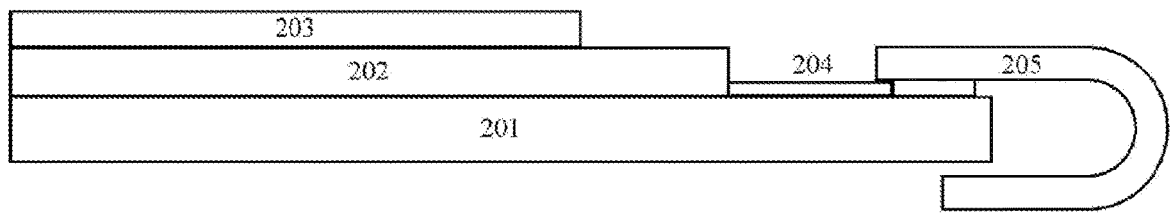
FIG. 2 schematically illustrates a simplified sectional view of a touch panel according to an exemplary embodiment.

In view of this, an exemplary embodiment provides a touch panel, as shown in FIG. 2, comprising a substrate 201; a display function stack 202 located on a side of the substrate 201; and a touch layer 203 located on a side of the display function stack 202 away from the substrate 201. In particular, the touch layer 203 and the display function stack 202 are electrically connected to a flexible circuit board 205 via a substrate wiring layer 204.

As used herein, the term "substrate wiring layer" refers to a collection of wirings disposed on a substrate. The substrate wiring layer typically includes a plurality of wires for transmitting various electrical signals required by the touch panel, such as a gate driving signal, a source driving signal, a touch signal, a display signal, and the like.

In the exemplary embodiment, the display function stack and the touch layer share a common flexible circuit board, so that the complexity of the structure and manufacturing process of the touch panel can be significantly decreased as compared to the touch panel shown in FIG. 1, which is advantageous for making the touch panel light and thin.

Figure 3:
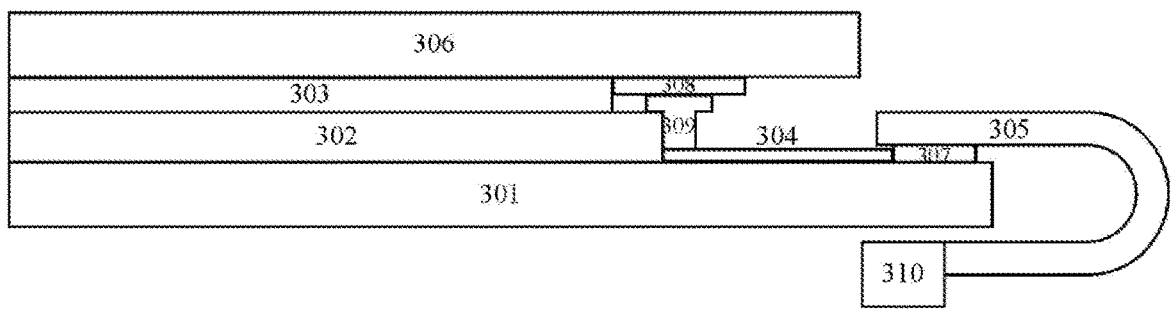
FIG. 3 schematically illustrates a simplified sectional view of a touch panel according to another exemplary embodiment.

FIG. 3 illustrates a simplified sectional view of a touch panel according to another exemplary embodiment. As shown in FIG. 3, the touch panel comprises a substrate 301; a display function stack 302 located on a side of the substrate 301; and a touch layer 303 located on a side of the display function stack 302 away from the substrate 301. In particular, the touch layer 303 and the display function stack 302 are electrically connected to a flexible circuit board 305 via a substrate wiring layer 304. Further, the touch panel further comprises a package cover 306 located on a side of the touch layer 303 away from the display function stack 302.

In the exemplary embodiment shown in FIG. 3, the touch layer is disposed on an inner side of the package cover, and the display function stack and the touch layer share a common flexible circuit board, so that the complexity of the structure and manufacturing process of the touch panel can be significantly decreased as compared to the touch panel shown in FIG. 1, which is advantageous for making the touch panel light and thin.

Further, as shown in FIG. 3, the touch panel further comprises a first contact 308 located on a side of the package cover 306 facing the display function stack 302. The touch layer 303 is electrically connected to the substrate wiring layer 304 via the first contact 308 and an electric conductor 309, the substrate wiring layer 304 is electrically connected to a second contact 307, and the second contact 307 is electrically connected to an external controller 310 via the flexible circuit board 305.

Figure 4:
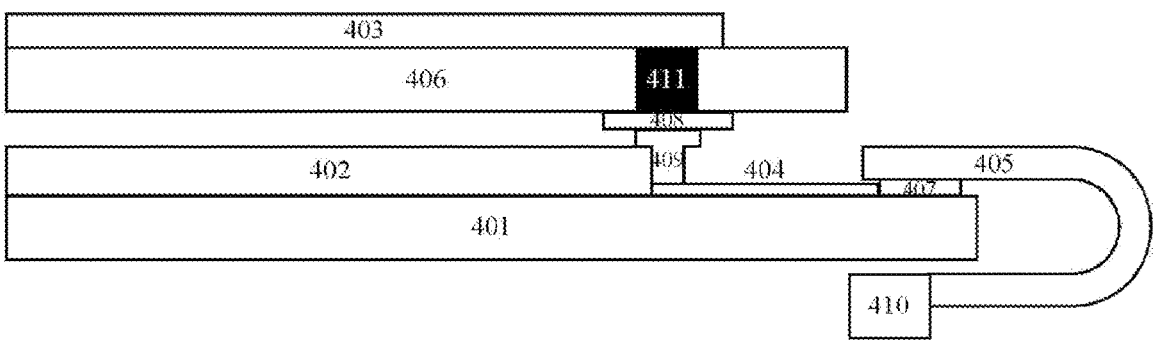
FIG. 4 schematically illustrates a simplified sectional view of a touch panel according to a further exemplary embodiment.

FIG. 4 illustrates a simplified sectional view of a touch panel according to a further exemplary embodiment. As shown in FIG. 4, the touch panel comprises a substrate 401; a display function stack 402 located on a side of the substrate 401; and a touch layer 403 located on a side of the display function stack 402 away from the substrate 401. In particular, the touch layer 403 and the display function stack 402 are electrically connected to a flexible circuit board 405 via a substrate wiring layer 404. Further, the touch panel further comprises a package cover 406 located between the display function stack 402 and the touch layer 403.

In the exemplary embodiment shown in FIG. 4, the touch layer is disposed on an outer side of the package cover, and the display function stack and the touch layer share a common flexible circuit board, so that the complexity of the structure and manufacturing process of the touch panel can be significantly decreased as compared to the touch panel shown in FIG. 1, which is advantageous for making the touch panel light and thin.

Further, as shown in FIG. 4, the touch panel further comprises a first contact 408 located on a side of the package cover 406 facing the display function stack 402. The touch layer 403 is electrically connected to the substrate wiring layer 404 via a first via hole 411 in the package cover 406, the first contact 408 and an electric conductor 409, the substrate wiring layer 404 is electrically connected to a second contact 407, and the second contact 407 is electrically connected to an external controller 410 via the flexible circuit board 405.

It is to be noted that although only one first via hole 411 is schematically illustrated in FIG. 4, in other exemplary embodiments, a plurality of first via holes 411 may be disposed in the package cover so as to electrically connect the touch layer 403 to the substrate wiring layer.

FIGS. 5-9 schematically illustrate specific sectional views of touch panels according to exemplary embodiments, respectively. In the touch panels shown in FIGS. 5-9, the touch layer, the second contact, and the package cover are omitted for the sake of simplicity. However, as will be appreciated by those skilled in the art, the exemplary embodiments of the touch panel shown in FIGS. 5-9 are applicable to any of the assembly modes shown in FIGS. 2-4. For example, in the touch panels shown in FIGS. 5-9, the assembly mode shown in FIG. 3 may be adopted, that is, the substrate wiring layer is electrically connected to the first contact, the touch layer is electrically connected to the substrate wiring layer via the second contact and the electric conductor, and the first contact is electrically connected to the external controller via the flexible circuit board. Alternatively, in the touch panels shown in FIGS. 5-9, the assembly mode shown in FIG. 4 may be adopted, that is, the substrate wiring layer is electrically connected to the first contact, the touch layer is electrically connected to the substrate wiring layer via the first via hole in the package cover, the second contact, and the electric conductor, and the first contact is electrically connected to the external controller via the flexible circuit board.

Figure 5:
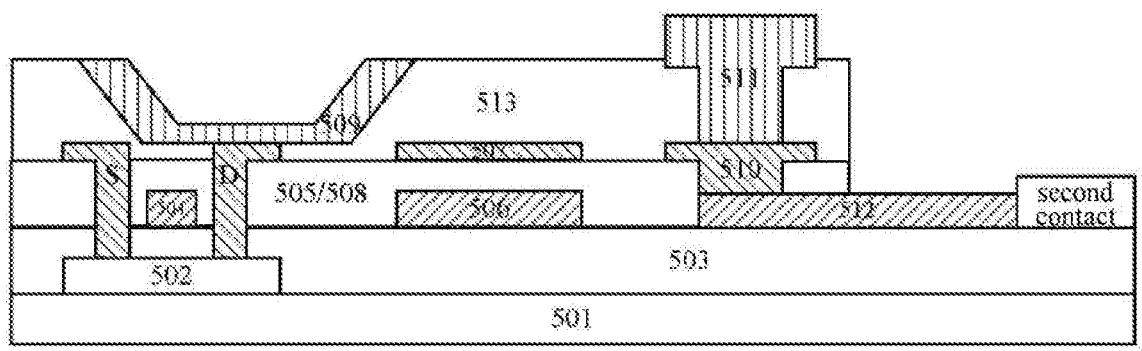
FIG. 5 schematically illustrates a sectional view of a touch panel according to an exemplary embodiment.

In an exemplary embodiment, as shown in FIG. 5, a display function stack and a substrate wiring layer 512 are located on a side of a substrate 501. Specifically, the display function stack comprises a transistor and a capacitor. The transistor comprises an active layer 502, a first insulating layer 503, a gate 504, a second insulating layer 505, a source S and a drain D, which are located above the substrate 501 successively. The capacitor comprises a first electrode 506 and a second electrode 507, which are located above the substrate 501 successively, and a first dielectric layer 508 between the first electrode 506 and the second electrode 507. The touch panel further comprises an electrode layer 509 located on a side of the drain D away from the substrate 501 and electrically connected to the drain D, and a third insulating layer 513 located between the electrode layer 509 and the source S. In particular, the second insulating layer 505 and the first dielectric layer 508 may be in a same layer.

Further, as shown in FIG. 5, the electric conductor comprises a first electric conductor 510 and a second electric conductor 511 that are electrically connected to each other. The gate 504, the first electrode 506, and the substrate wiring layer 512 are located in the same layer and fabricated by the same process. The source S, the drain D, the second electrode 507, and the first electric conductor 510 are located in the same layer and fabricated by the same process. The electrode layer 509 and the second electric conductor 511 are located in the same layer and fabricated by the same process.

As used herein, two structures being "located in the same layer and fabricated by the same process" means that the two structures may be formed by the same patterning process during fabrication. As will be appreciated by those skilled in the art, the "same layer" is not necessarily a flat or continuous layer in view of the underlying structure.

When the touch panel shown in FIG. 5 is being manufactured, the gate, the first electrode, and the substrate wiring layer may be formed by the same patterning process, the source, the drain, the second electrode, and the first electric conductor may be formed by the same patterning process, and the electrode layer and the second electric conductor may be formed by the same patterning process.

In the exemplary embodiment shown in FIG. 5, the first electric conductor is formed while the source, the drain, and the second electrode are being formed, and the second electric conductor is formed while the electrode layer 509 is being formed. The first electric conductor and the second electric conductor constitute an electric conductor. In this way, when the embodiment shown in FIG. 5 is applied to the assembly modes shown in FIGS. 2-4, the touch layer can be electrically connected to the substrate wiring layer via the electric conductor without increasing the number of the process steps and complexity, which can thus significantly decrease the complexity of the structure and manufacturing process of the touch panel, and is advantageous for making the touch panel light and thin.

Figure 6:
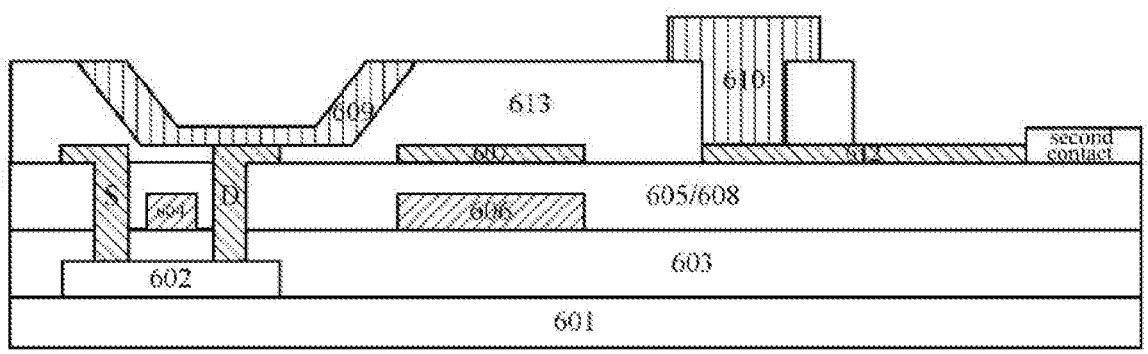
FIG. 6 schematically illustrates a sectional view of a touch panel according to an exemplary embodiment.

In another exemplary embodiment, as shown in FIG. 6, a display function stack and a substrate wiring layer 612 are located on a side of a substrate 601. Specifically, the display function stack comprises a transistors and a capacitor. The transistor comprises an active layer 602, a first insulating layer 603, a gate 604, a second insulating layer 605, a source S and a drain D, which are located above the substrate 601 successively. The capacitor comprises a first electrode 606 and a second electrode 607, which are located above the substrate 601 successively, and a first dielectric layer 608 between the first electrode 606 and the second electrode 607. The touch panel further comprises an electrode layer 609 located on a side of the drain D away from the substrate 601 and electrically connected to the drain D, and a third insulating layer 613 located between the electrode layer 609 and the source S. In particular, the second insulating layer 605 and the first dielectric layer 608 may be in a same layer.

Further, as shown in FIG. 6, the gate 604 and the first electrode 606 are located in the same layer and fabricated by the same process. The source S, the drain D, the second electrode 607, and the substrate wiring layer 612 are located in the same layer and fabricated by the same process. The electrode layer 609 and an electric conductor 610 are located in the same layer and fabricated by the same process.

When the touch panel shown in FIG. 6 is being manufactured, the gate and the first electrode may be formed by the same patterning process, the source, the drain, the second electrode, and the substrate wiring layer may be formed by the same patterning process, and the electrode layer and the electric conductor may be formed by the same patterning process.

In the exemplary embodiment shown in FIG. 6, the electric conductor is formed while the electrode layer is being formed. In this way, when the embodiment shown in FIG. 6 is applied to the assembly modes shown in FIGS. 2-4, the touch layer can be electrically connected to the substrate wiring layer via the electric conductor without increasing the number of the process steps and complexity, which can thus significantly decrease the complexity of the structure and manufacturing process of the touch panel, and is advantageous for making the touch panel light and thin.

Figure 7:
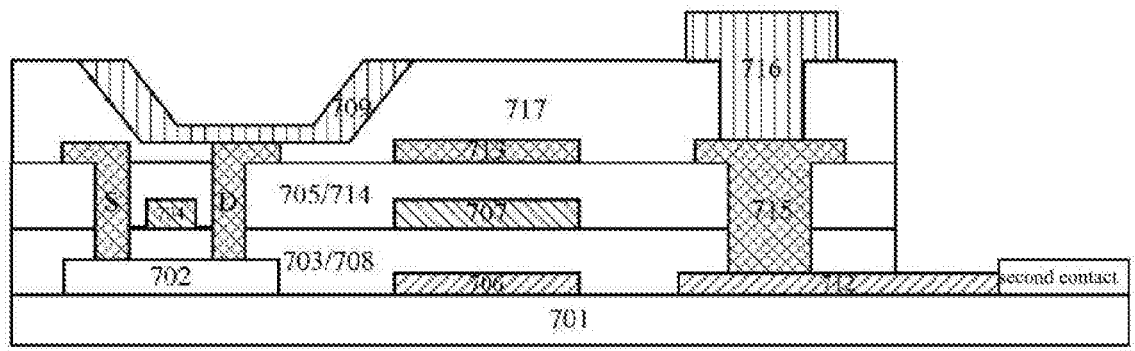
FIG. 7 schematically illustrates a sectional view of a touch panel according to an exemplary embodiment.

In another exemplary embodiment, as shown in FIG. 7, a display function stack and a substrate wiring layer 712 are located on a side of a substrate 701. Specifically, the display function stack comprises a transistor and a capacitor. The transistor comprises an active layer 702, a first insulating layer 703, a gate 704, a second insulating layer 705, a source S and a drain D, which are located above the substrate 701 successively. The capacitor comprises a first electrode 706 and a second electrode 707, which are located above the substrate 701 successively, a first dielectric layer 708 between the first electrode 706 and the second electrode 707, a third electrode 713 above the second electrode 707, and a second dielectric layer 714 between the second electrode 707 and the third electrode 713. The touch panel further comprises an electrode layer 709 located on a side of the drain D away from the substrate 701 and electrically connected to the drain D, and a third insulating layer 717 located between the electrode layer 709 and the source S. In particular, the first insulating layer 703 and the first dielectric layer 708 may be in the same layer, and the second insulating layer 705 and the second dielectric layer 714 may be in the same layer to simplify the manufacturing process and reduce the manufacturing cost.

Further, as shown in FIG. 7, the electric conductor comprises a first electric conductor 715 and a second electric conductor 716 that are electrically connected to each other. The first electrode 706 and the substrate wiring layer 712 are located in the same layer and fabricated by the same process. The gate 704 and the second electrode 707 are located in the same layer and fabricated by the same process. The source S, the drain D, the third electrode 713, and the first electric conductor 715 are located in the same layer and fabricated by the same process. The electrode layer 709 and the second electric conductor 716 are located in the same layer and fabricated by the same process.

When the touch panel shown in FIG. 7 is being manufactured, the first electrode and the substrate wiring layer may be formed by the same patterning process, the gate and the second electrode may be formed by the same patterning process, the source, the drain, the third electrode, and the first electric conductor may be formed by the same patterning process, and the electrode layer and the second electric conductor may be formed by the same patterning process.

In the exemplary embodiment shown in FIG. 7, the first electric conductor is formed while the source, the drain, and the third electrode are being formed, and the second electric conductor is formed while the electrode layer is being formed, wherein the first electric conductor and the second electric conductor constitute an electric conductor. In this way, when the exemplary embodiment shown in FIG. 7 is applied to the assembly modes shown in FIGS. 2-4, the touch layer can be electrically connected to the substrate wiring layer via the electric conductor without increasing the number of the process steps and complexity, which can thus significantly decrease the complexity of the structure and manufacturing process of the touch panel, and is advantageous for making the touch panel light and thin. Moreover, in this embodiment, since the capacitor can actually be regarded as two sub-capacitors connected in parallel, the capacitance value of the capacitor can be increased, thereby improving the performance of the touch panel.

Figure 8:
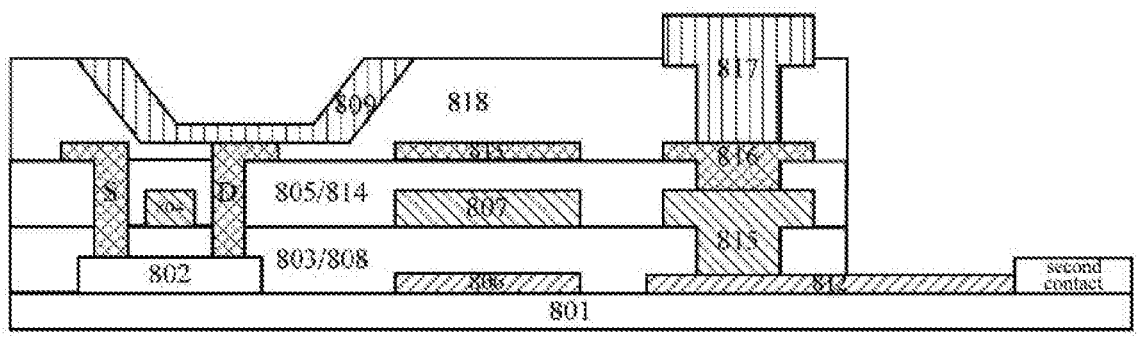
FIG. 8 schematically illustrates a sectional view of a touch panel according to an exemplary embodiment.

In another exemplary embodiment, as shown in FIG. 8, a display function stack and a substrate wiring layer 812 are located on a side of a substrate 801. Specifically, the display function stack comprises a transistor and a capacitor. The transistor comprises an active layer 802, a first insulating layer 803, a gate 804, a second insulating layer 805, a source S and a drain D, which are located above the substrate 801 successively. The capacitor comprises a first electrode 806 and a second electrode 807, which are located above the substrate 801 successively, a first dielectric layer 808 between the first electrode 806 and the second electrode 807, a third electrode 813 above the second electrode 807, and a second dielectric layer 814 between the second electrode 807 and the third electrode 813. The touch panel further comprises an electrode layer 809 located on a side of the drain D away from the substrate 801 and electrically connected to the drain D, and a third insulating layer 818 located between the electrode layer 809 and the source S. In particular, the first insulating layer 803 and the first dielectric layer 808 may be in the same layer, and the second insulating layer 805 and the second dielectric layer 814 may be in the same layer to simplify the manufacturing process and reduce the manufacturing cost.

Further, as shown in FIG. 8, the electric conductor comprises a first electric conductor 815, a second electric conductor 816, and a third electric conductor 817 that are electrically connected to each other. The first electrode 806 and the substrate wiring layer 812 are located in the same layer and fabricated by the same process. The gate 804, the second electrode 807, and the first electric conductor 815 are located in the same layer and fabricated by the same process. The source S, the drain D, the third electrode 813, and the second electric conductor 816 are located in the same layer and fabricated by the same process. The electrode layer 809 and the third electric conductor 817 are located in the same layer and fabricated by the same process.

When the touch panel shown in FIG. 8 is being manufactured, the first electrode and the substrate wiring layer may be formed by the same patterning process, the gate, the second electrode, and the first electric conductor may be formed by the same patterning process, the source, the drain, the third electrode, and the second electric conductor may be formed by the same patterning process, and the electrode layer and the third electric conductor may be formed by the same patterning process.

In the exemplary embodiment shown in FIG. 8, the first electric conductor is formed while the gate and the second electrode are being formed, the second electric conductor is formed while the source, the drain, and the third electrode are being formed, and the third electric conductor 817 is formed while the electrode layer is being formed, wherein the first electric conductor, the second electric conductor and the third electric conductor constitute an electric conductor. In this way, when the embodiment shown in FIG. 8 is applied to the assembly modes shown in FIGS. 2-4, the touch layer can be electrically connected to the substrate wiring layer via the electric conductor without increasing the number of the process steps and complexity, which can thus significantly decrease the complexity of the structure and manufacturing process of the touch panel, and is advantageous for making the touch panel light and thin. Moreover, in this embodiment, since the capacitor can actually be regarded as two sub-capacitors connected in parallel, the capacitance value of the capacitor can be increased, thereby improving the performance of the touch panel.

Figure 9:
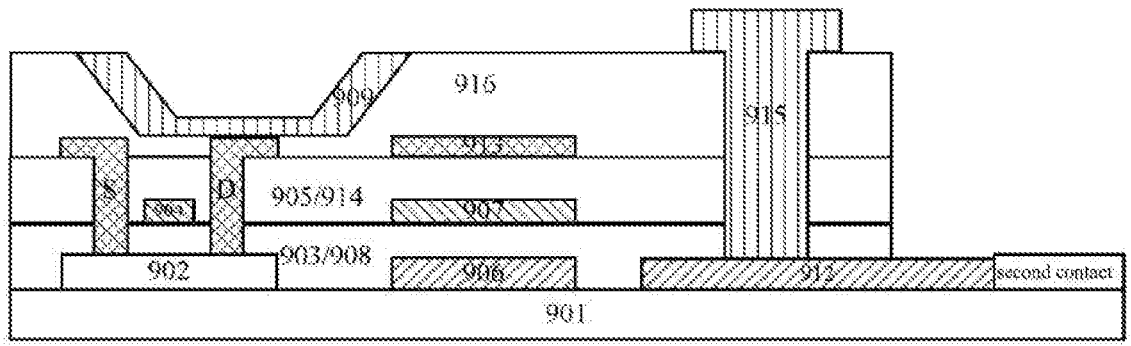
FIG. 9 schematically illustrates a sectional view of a touch panel according to an exemplary embodiment.

In a further exemplary embodiment, as shown in FIG. 9, a display function stack and a substrate wiring layer 912 are located on a side of a substrate 901. Specifically, the display function stack comprises a transistor and a capacitor. The transistor comprises an active layer 902, a first insulating layer 903, a gate 904, a second insulating layer 905, a source S and a drain D, which are located above the substrate 901 successively. The capacitor comprises a first electrode 906 and a second electrode 907, which are located above the substrate 901 successively, a first dielectric layer 908 between the first electrode 906 and the second electrode 907, a third electrode 913 above the second electrode 907, and a second dielectric layer 914 between the second electrode 907 and the third electrode 913. The touch panel further comprises an electrode layer 909 located on a side of the drain D away from the substrate 901 and electrically connected to the drain D, and a third insulating layer 916 located between the electrode layer 909 and the source S. In particular, the first insulating layer 903 and the first dielectric layer 908 may be in the same layer, and the second insulating layer 905 and the second dielectric layer 914 may be in the same layer to simplify the manufacturing process and reduce the manufacturing cost.

Further, as shown in FIG. 9, the electric conductor is formed of a conductive material filling a second via hole 915. The second via hole 915 penetrates the entire thickness above the substrate wiring layer 912.

When the touch panel shown in FIG. 9 is being manufactured, the electric conductor may be formed by steps of: forming a second via hole 915 that penetrates the entire thickness above the substrate wiring layer 912; and filling the second via hole 915 with a conductive material. For example, in an exemplary embodiment, the second via hole may be formed by etching or laser ablation, and the second via hole may be filled by metal implantation.

It is to be noted that although the concept of the present disclosure has been described in the foregoing exemplary embodiments taking a top gate type transistor as an example, the scope of the present disclosure is not limited thereto, but the principle of the present disclosure is equally applicable to touch panels comprising a transistor having a bottom gate type structure or other types of structures.

Other exemplary embodiments provide a touch device comprising any of the touch panels described above. Such a touch device may be applied to various display devices, for example, any product or component having display and touch function such as a mobile phone, a tablet computer, a television, a display, a notebook computer, a digital photo frame, a navigator, an electronic paper, and the like.

Figure 10:
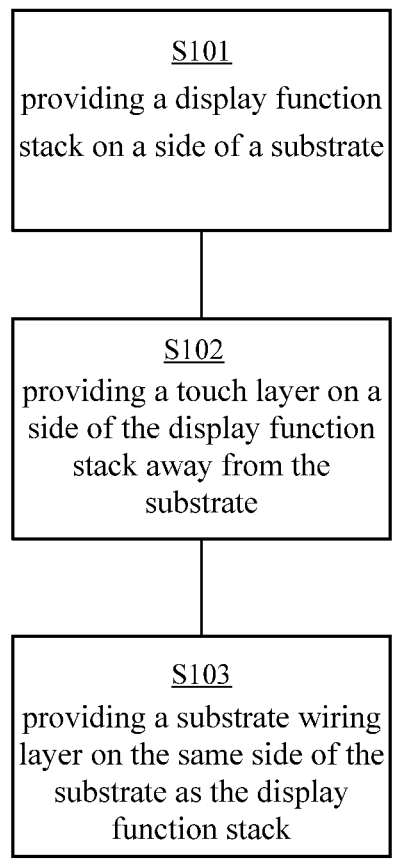
FIG. 10 is a flowchart of a method for manufacturing a touch panel according to an exemplary embodiment.

Exemplary embodiments provide a method for manufacturing any of the touch panels described above. FIG. 10 is a flowchart of a method for manufacturing a touch panel according to an exemplary embodiment. As shown in FIG. 10, at step S101, a display function stack is provided on a side of a substrate. At step S102, a touch layer is provided on a side of the display function stack away from the substrate. At step S103, a substrate wiring layer is provided on the same side of the substrate as the display function stack, wherein the touch layer and the display function stack are electrically connected to a flexible circuit board via the substrate wiring layer.

In such a method for manufacturing a touch panel, the display function stack and the touch layer share a common flexible circuit board, so that the complexity of the structure and manufacturing process of the touch panel can be significantly reduced as compared to the touch panel shown in FIG. 1, which is advantageous for making the touch panel light and thin.

Unless otherwise defined, technical terms or scientific terms used in the present disclosure should have common meanings understood by a person of ordinary skill in the field to which the present disclosure pertains. The words such as "first", "second", and the like used in the present disclosure do not denote any order, quantity, or importance, but are used to distinguish different components. Similarly, the words such as "a", "an", "the" and the like do not indicate limitation in number, but mean the presence of at least one. The word such as "comprising", "including" or the like mean that an element or item preceding the word encompasses elements or items and equivalents thereof listed after said word, but do not exclude other elements or items. The words such as "connected", "coupled" and the like are not limited to physical or mechanical connections, but may include electrical connections, regardless of being direct or indirect. "Upper", "lower", "left", "right", or the like is only used to indicate a relative positional relationship, and when the absolute position of the described object is changed, the relative positional relationship may also change accordingly. It is to be noted that the features in the above-described embodiments may be used in any combination in case of causing no conflict.

What have been stated above are merely specific exemplary embodiments, but the scope of the present disclosure is not so limited. Any variations or substitutions that can be easily conceived by those ordinarily skilled in the art within the technical scope revealed by the present disclosure should be encompassed within the scope of the present disclosure. Therefore, the scope of the present disclosure should be determined by the scope of the claims.

The invention claimed is:

1. A touch panel comprising:
a substrate;
a package cover;
a display function stack on a side of the substrate;
a touch layer on a side of the display function stack away from the substrate, and the touch layer being on a side of the package cover away from the display function stack;
a first contact on a side of the package cover facing the display function stack,
wherein the touch layer is electrically connected to the first contact via at least one via hole disposed in the package cover,
wherein the touch layer is electrically connected to the substrate wiring layer via the first contact,
wherein the touch layer and the display function stack are electrically connected to a flexible circuit board via a substrate wiring layer.

2. The touch panel according to claim 1, wherein the touch layer is between the display function stack and the package cover.

3. The touch panel according to claim 1, wherein at least one of the first contact and the at least one via hole are disposed at an edge of the package cover.

4. The touch panel according to claim 1, further comprising an electric conductor between the first contact and the substrate wiring layer, wherein the first contact is electrically connected to the substrate wiring layer via the electric conductor.

5. The touch panel according to claim 4, wherein the display function stack comprises a transistor, a capacitor, and an electrode layer;
a gate of the transistor and a first electrode of the capacitor are located in a same layer and fabricated by a same process;
a source of the transistor, a drain of the transistor, a second electrode of the capacitor, and the substrate wiring layer are located in a same layer and fabricated by a same process; and
the electrode layer and the electric conductor are located in a same layer and fabricated by a same process.

6. The touch panel according to claim 4, wherein the display function stack comprises a transistor, a capacitor, and an electrode layer;

a first electrode of the capacitor and the substrate wiring layer are located in a same layer and fabricated by a same process;

a gate of the transistor and a second electrode of the capacitor are located in a same layer and fabricated by a same process;

a source of the transistor, a drain of the transistor and a third electrode of the capacitor are located in a same layer and fabricated by a same process; and the electrode layer and the electric conductor are located in a same layer and fabricated by a same process.

7. The touch panel according to claim 4, wherein the electric conductor comprises a first electric conductor and a second electric conductor;

the display function stack comprises a transistor, a capacitor, and an electrode layer;

a gate of the transistor, a first electrode of the capacitor, and the substrate wiring layer are located in a same layer and fabricated by a same process;

a source of the transistor, a drain of the transistor, a second electrode of the capacitor, and the first electric conductor are located in a same layer and fabricated by a same process; and the electrode layer and the second electric conductor are located in a same layer and fabricated by a same process.

8. The touch panel according to claim 4, wherein the electric conductor comprises a first electric conductor and a second electric conductor;

the display function stack comprises a transistor, a capacitor, and an electrode layer;

a first electrode of the capacitor and the substrate wiring layer are located in a same layer and fabricated by a same process;

a gate of the transistor and a second electrode of the capacitor are located in a same layer and fabricated by a same process;

a source of the transistor, a drain of the transistor, a third electrode of the capacitor, and the first electric conductor are located in a same layer and fabricated by a same process; and the electrode layer and the second electric conductor are located in a same layer and fabricated by a same process.

9. The touch panel according to claim 4, wherein the electric conductor comprises a first electric conductor, a second electric conductor, and a third electric conductor;

the display function stack comprises a transistor, a capacitor, and an electrode layer;

a first electrode of the capacitor and the substrate wiring layer are located in a same layer and fabricated by a same process;

a gate of the transistor, a second electrode of the capacitor, and the first electric conductor are located in a same layer fabricated by a same process;

a source of the transistor, a drain of the transistor, a third electrode of the capacitor, and the second electric conductor are located in a same layer and fabricated by a same process;

the electrode layer and the third electric conductor are located in a same layer and fabricated by a same process.

10. The touch panel according to claim 1, wherein the substrate wiring layer is electrically connected to a second contact, and the second contact is electrically connected to an external controller via the flexible circuit board.

11. A touch device comprising the touch panel according to claim 1.

12. A touch device comprising the touch panel according to claim 4.

* * * * *